United States Patent
Kunishima et al.

(10) Patent No.: US 9,508,662 B2
(45) Date of Patent: Nov. 29, 2016

(54) OPTICAL SEMICONDUCTOR DEVICE

(71) Applicant: Renesas Electronics Corporation, Koutou-ku, Tokyo (JP)

(72) Inventors: Hiroyuki Kunishima, Tokyo (JP); Yasutaka Nakashiba, Tokyo (JP); Masaru Wakabayashi, Tokyo (JP); Shinichi Watanuki, Tokyo (JP); Ken Ozawa, Tokyo (JP); Tatsuya Usami, Tokyo (JP); Yoshiaki Yamamoto, Tokyo (JP); Keiji Sakamoto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/827,841

(22) Filed: Aug. 17, 2015

(65) Prior Publication Data

US 2016/0056115 A1 Feb. 25, 2016

(30) Foreign Application Priority Data

Aug. 21, 2014 (JP) .................................. 2014-168258

(51) Int. Cl.
| | |
|---|---|
| G02B 6/12 | (2006.01) |
| H01L 23/60 | (2006.01) |
| G02F 1/01 | (2006.01) |
| G02F 1/025 | (2006.01) |
| H01L 31/02 | (2006.01) |
| H05K 1/02 | (2006.01) |
| G02B 6/43 | (2006.01) |

(52) U.S. Cl.
CPC ............. *H01L 23/60* (2013.01); *G02F 1/0121* (2013.01); *G02F 1/025* (2013.01); *H01L 31/02002* (2013.01); *H05K 1/0296* (2013.01); *G02B 6/43* (2013.01); *G02F 2201/12* (2013.01); *G02F 2202/105* (2013.01)

(58) Field of Classification Search
CPC ........... H01L 23/60; G02B 6/30; G02B 6/04; G02B 6/120043; H05K 1/0296
See application file for complete search history.

(56) References Cited

U.S. PATENT DOCUMENTS

| | | | |
|---|---|---|---|
| 5,061,979 A | 10/1991 | Kobayashi et al. | |
| 6,198,118 B1 | 3/2001 | Holcombe | |
| 6,528,776 B1 | 3/2003 | Marsland | |

(Continued)

FOREIGN PATENT DOCUMENTS

| | | |
|---|---|---|
| EP | 0 942 472 A2 | 9/1999 |
| JP | 2012-027198 A | 2/2012 |

OTHER PUBLICATIONS

Extended European search report for European Patent Application no. 15180398.8, Jan. 22, 2016.

*Primary Examiner* — Sung Pak
*Assistant Examiner* — Hoang Tran
(74) *Attorney, Agent, or Firm* — Shapiro, Gabor and Rosenberger, PLLC

(57) ABSTRACT

A technique is provided which can prevent the quality of an electrical signal from degrading in an optical semiconductor device.
In a cross-section perpendicular to an extending direction of an electrical signal transmission line, the electrical signal transmission line is surrounded by a shielding portion including a first noise cut wiring, second plugs, a first layer wiring, first plugs, a shielding semiconductor layer, first plugs, a first layer wiring, second plugs, and a second noise cut wiring, and the shielding portion is fixed to a reference potential. Thereby, the shielding portion blocks noise due to effects of a magnetic field or an electric field from the semiconductor substrate, which affects the electrical signal transmission line.

9 Claims, 16 Drawing Sheets

(56) References Cited

U.S. PATENT DOCUMENTS

2013/0037902 A1* 2/2013 Nakazawa ........ H01L 27/14627 257/432

2014/0369642 A1* 12/2014 Yanagisawa ....... G02B 6/12002 385/14

* cited by examiner

OPTICAL SEMICONDUCTOR DEVICE

CROSS-REFERENCE TO RELATED APPLICATIONS

The disclosure of Japanese Patent Application No. 2014-168258 filed on Aug. 21, 2014 including the specification, drawings and abstract is incorporated herein by reference in its entirety.

BACKGROUND

The present invention relates to an optical semiconductor device and, for example, can be preferably used for an optical semiconductor device including various optical devices and electrical devices in a semiconductor chip.

Japanese Patent Laid-Open No. 2012-027198 (Patent Document 1) describes an optical semiconductor device including an optical waveguide that is a part of a semiconductor layer, a first impurity region which is formed in the semiconductor layer on one side of the optical waveguide and into which impurities of a first conductivity type are introduced, and a second impurity region which is formed in the semiconductor layer on the other side of the optical waveguide and into which impurities of a second conductivity type opposite to the first conductivity type are introduced. The optical semiconductor device includes a lower electrode that is a part of the second impurity region, an insulating film formed at least over the lower electrode, a capacitor including an upper electrode formed over the insulating film, and a third impurity region which is formed in the semiconductor layer at a part of a lower region of the upper electrode and into which the first conductivity type impurities are introduced.

In recent years, a technology in which optical signal transmission lines made of silicon are manufactured and an optical communication module is realized by integrating various optical devices and electronic devices using an optical circuit formed by the optical signal transmission lines as a platform, that is, a so-called silicon photonics technology, is actively developed. However, in the silicon photonics technology where various optical devices and electrical devices are included in a semiconductor chip, there is a problem that the quality of an electrical signal degrades due to effects of noise from a semiconductor substrate to an electrical signal transmission path.

The other purposes and new features will become clear from the description of the present specification and the accompanying drawings.

An optical semiconductor device according to an embodiment includes an insulating film over a semiconductor substrate, an optical waveguide of an optical signal transmission line formed from a semiconductor layer formed in a first region over the insulating film, a shielding semiconductor layer formed from the semiconductor layer formed in a second region over the insulating film, a multilayer wiring of n layers (n≥2), and an electrical signal transmission line formed by mth layer wiring (n≥m≥1) in the second region. The optical semiconductor device further includes a first noise cut wiring and a second noise cut wiring which are respectively formed on both sides of the electrical signal transmission line and which are formed from the mth layer wiring (n≥m≥1) that is away from and in parallel with the electrical signal transmission line, a first conductive portion that electrically couples the first noise cut wiring and the shielding semiconductor layer, and a second conductive portion that electrically couples the second noise cut wiring and the shielding semiconductor layer. In a cross-section perpendicular to an extending direction of the electrical signal transmission line, the electrical signal transmission line is surrounded by a shielding portion including the first noise cut wiring, the second noise cut wiring, the first conductive portion, the second conductive portion, and the shielding semiconductor layer, and the shielding portion is fixed to a reference potential.

According to an embodiment, it is possible to prevent the quality of an electrical signal from degrading in an optical semiconductor device.

DETAILED DESCRIPTION

Figure 1:
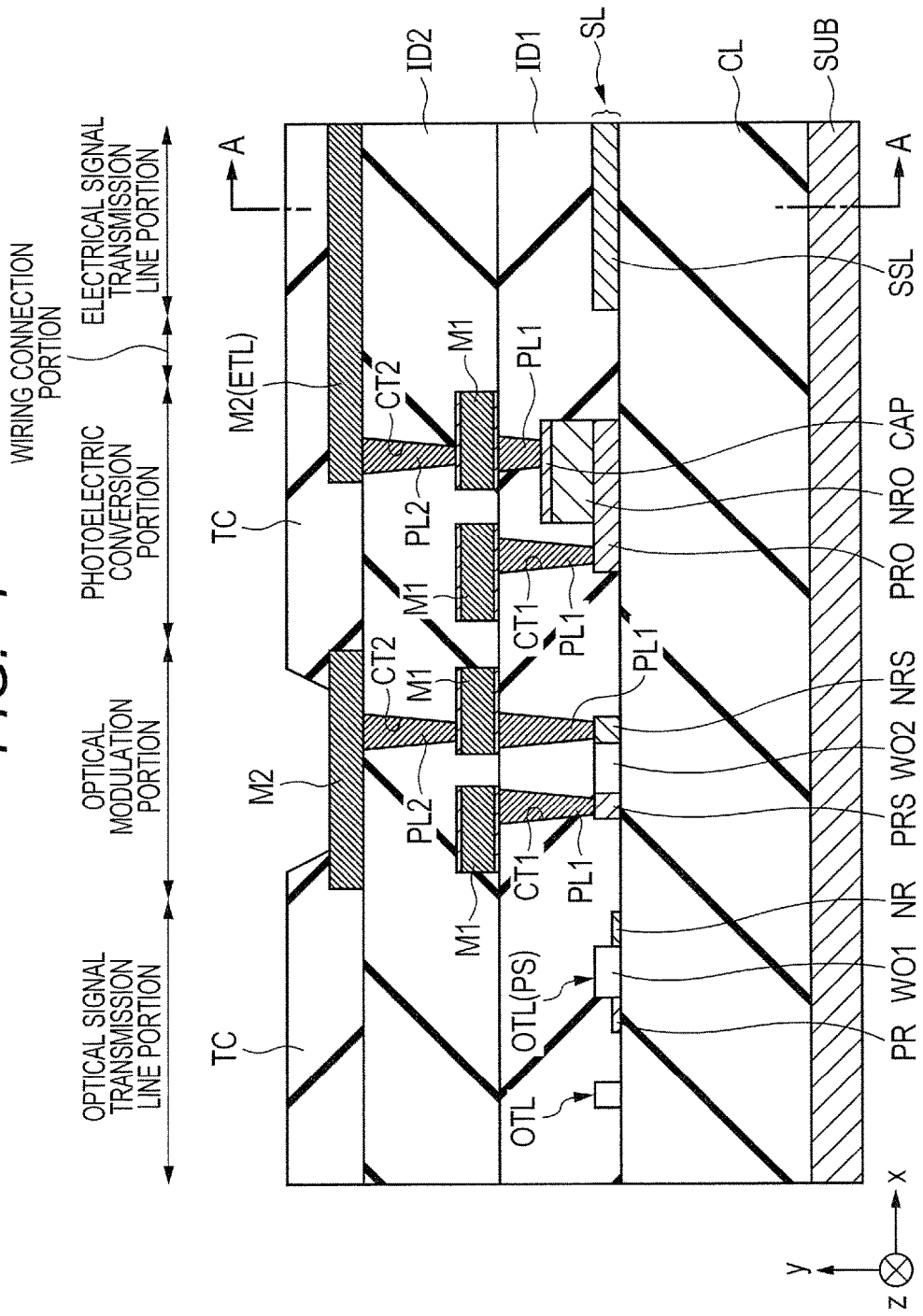
FIG. 1 is a main portion cross-sectional view of an optical semiconductor device according to a first embodiment.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Further, in the following embodiments, it is needless to say that an element (including an element step etc.) is not necessarily indispensable, except for the case where it is clearly specified in particular and where it is considered to be clearly indispensable from a theoretical point of view, etc.

Further, when using words of "formed from A", "formed of A", "have A", and "include A", it is needless to say that elements other than A are not excluded, except for the case where it is clearly specified that there is only A, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In the drawings used in the embodiments described below, in order to make a drawing easy to read, hatching may be added even if it is a plan view. In all the drawings for explaining the embodiments described below, the same symbol is attached to the same member, as a principle, and the repeated explanation thereof is omitted. Hereinafter, the embodiments will be described in detail with reference to the drawings.

First Embodiment

Figure 2:
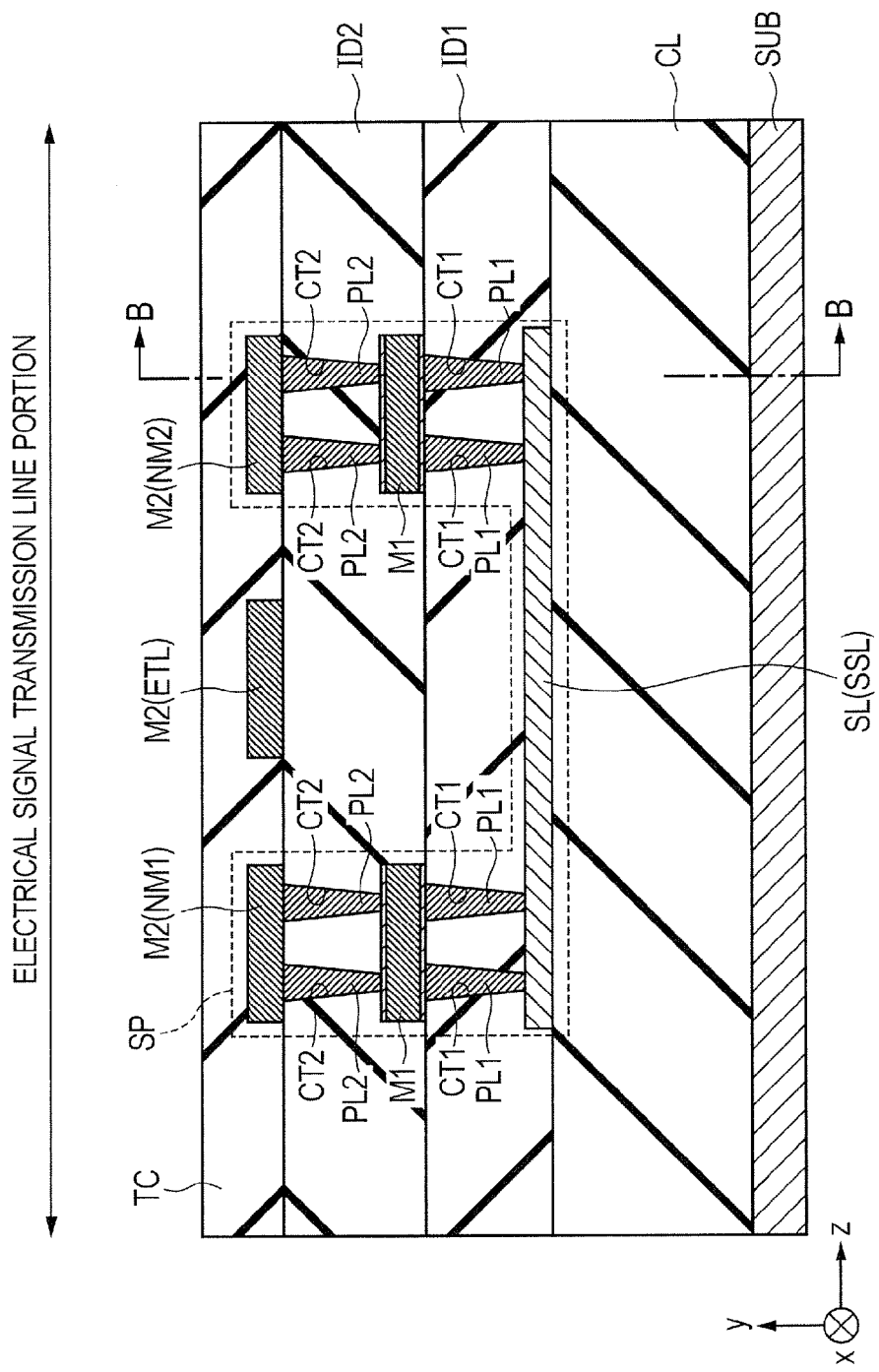
FIG. 2 is a main portion cross-sectional view of the optical semiconductor device taken along line A-A in FIG. 1.
Figure 3:
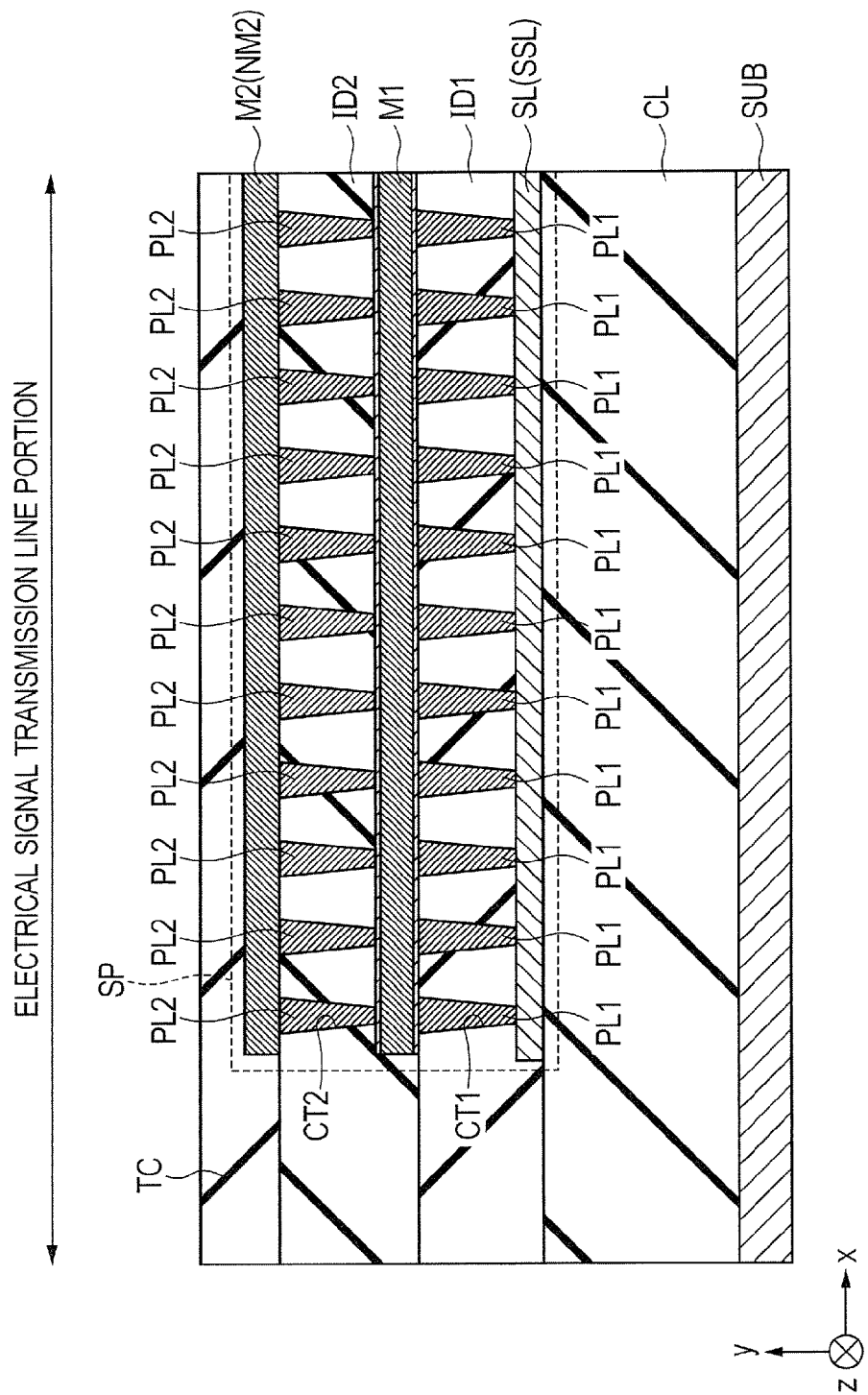
FIG. 3 is a main portion cross-sectional view of the optical semiconductor device taken along line B-B in FIG. 2.
Figure 4:
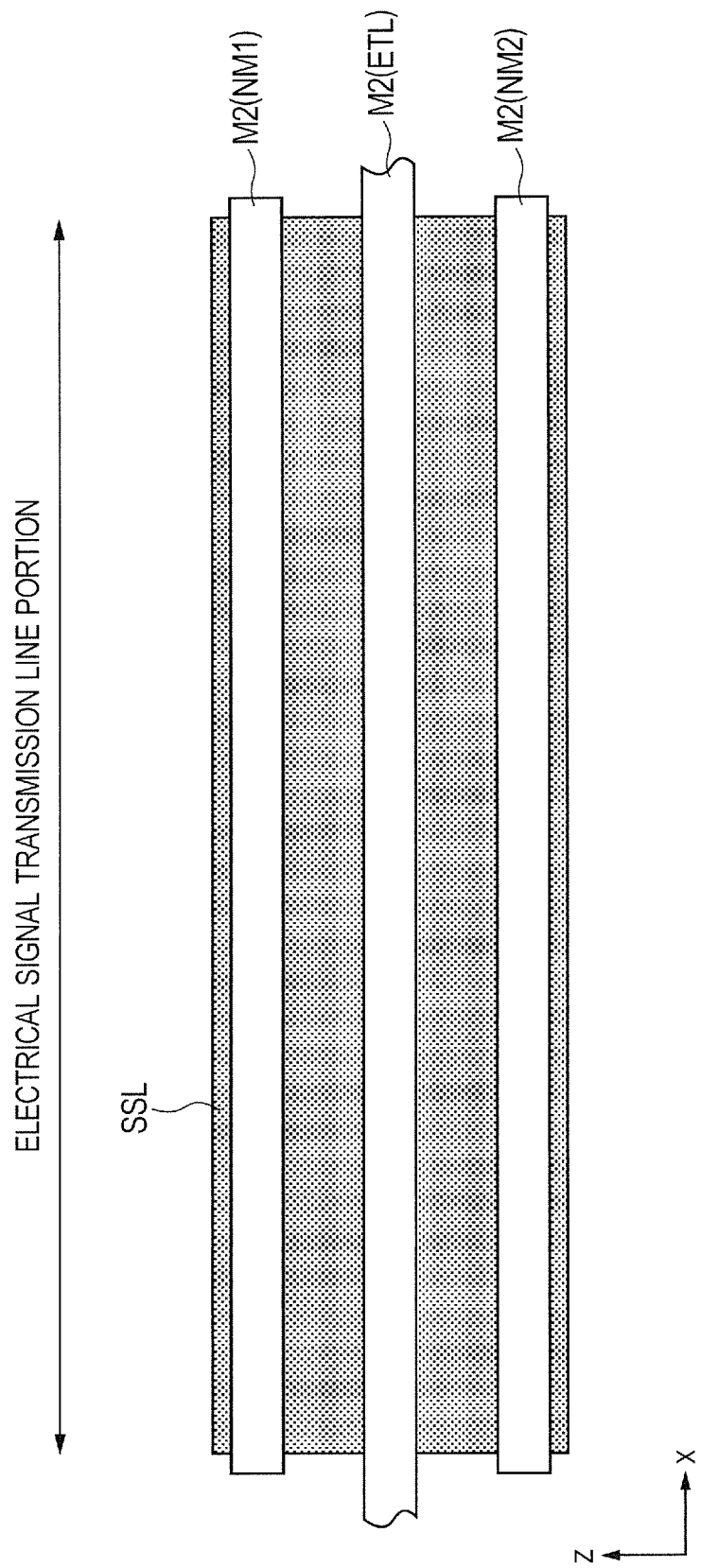
FIG. 4 is a main portion top view of an electrical signal transmission line portion according to the first embodiment.
Figure 5:
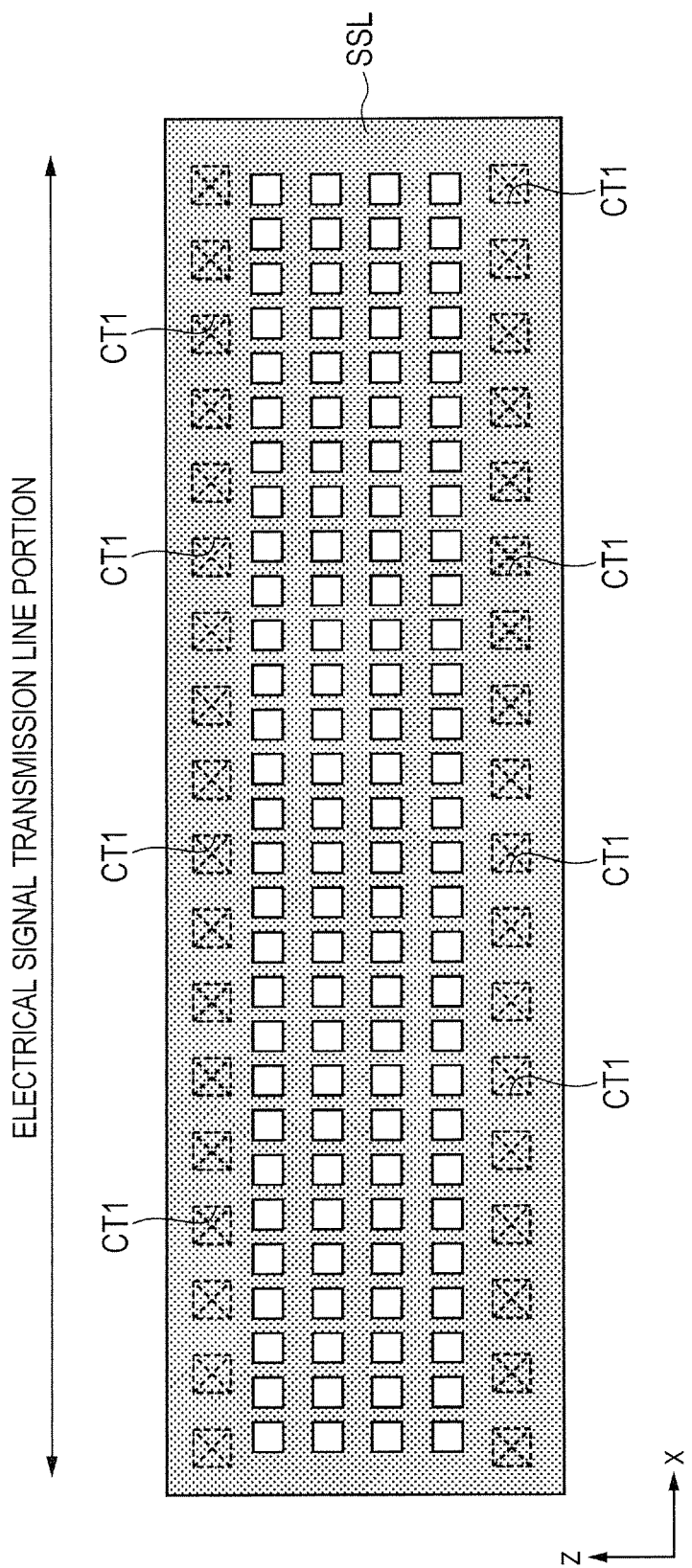
FIG. 5 is a main portion plan view of a first example of a shielding semiconductor layer included in the electrical signal transmission line portion according to the first embodiment.
Figure 6:
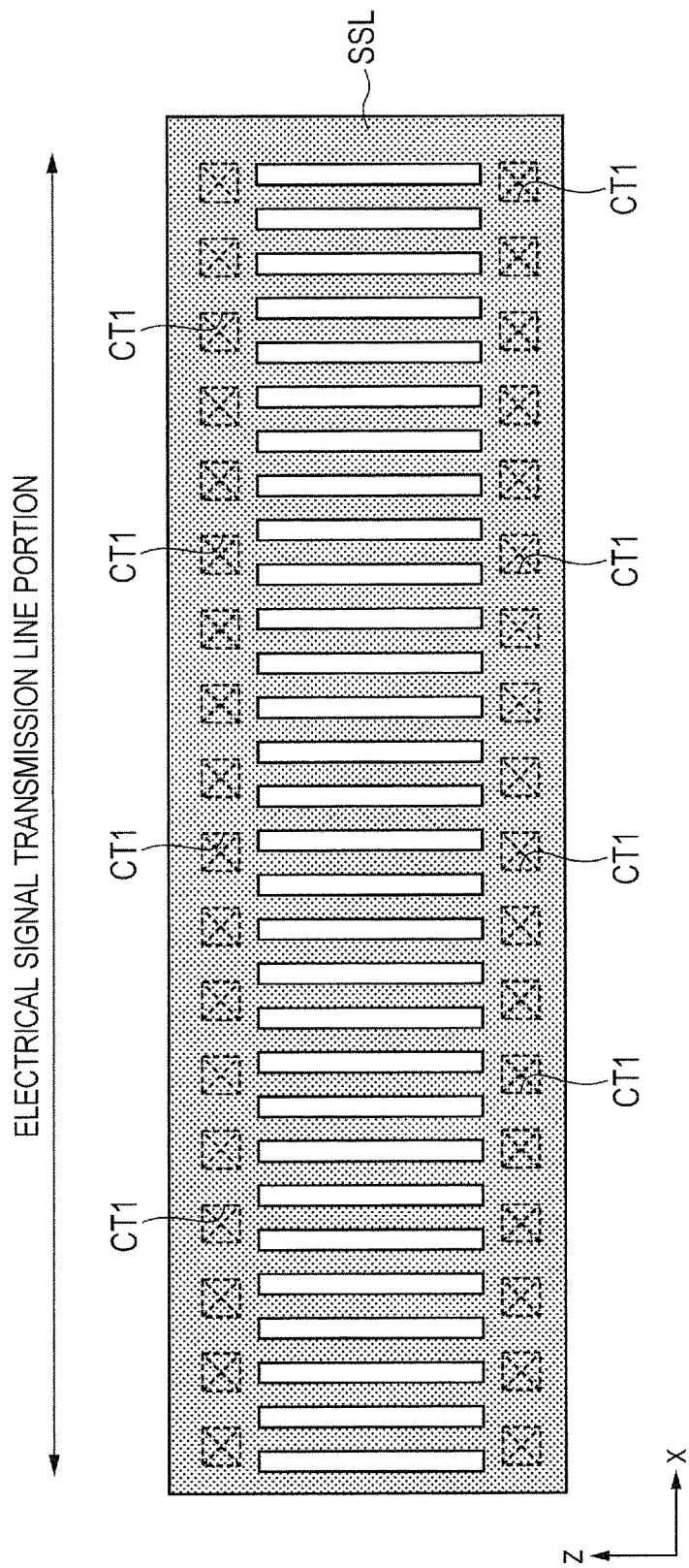
FIG. 6 is a main portion plan view of a second example of the shielding semiconductor layer included in the electrical signal transmission line portion according to the first embodiment.

An optical semiconductor device according to the first embodiment will be described with reference to FIGS. 1 to 6. FIG. 1 is a main portion cross-sectional view of the optical semiconductor device according to the first embodiment. FIG. 2 is a main portion cross-sectional view of the optical semiconductor device taken along line A-A in FIG. 1. FIG. 3 is a main portion cross-sectional view of the optical semiconductor device taken along line B-B in FIG. 2. FIG. 4 is a main portion top view of an electrical signal transmission line portion according to the first embodiment. FIG. 5 is a main portion plan view of a first example of a shielding semiconductor layer included in the electrical signal transmission line portion according to the first embodiment. FIG. 6 is a main portion plan view of a second example of the shielding semiconductor layer included in the electrical signal transmission line portion according to the first embodiment.

In the first embodiment, the optical semiconductor device will be exemplified, which includes, as shown in FIG. 1, an optical signal transmission line portion, an optical modulation portion, a photoelectric conversion portion, a wiring coupling portion, and an electrical signal transmission line portion, which are integrated on a semiconductor substrate SUB formed of, for example, single crystal silicon. In the first embodiment, the optical semiconductor device having multilayer wiring of two-layer structure is exemplified. However, the first embodiment is not limited to this.

Optical Signal Transmission Line Portion

As shown in FIG. 1, in the optical signal transmission line portion, various optical signal transmission lines (also referred to as optical signal lines) OTL are formed. The optical signal transmission line OTL is configured by a semiconductor layer (also referred to as a SOI layer) SL formed of silicon, which is formed over the semiconductor substrate SUB through an insulating film (also referred to as a BOX layer) CL. The thickness of the insulating film CL is, for example, about 2 to 3 µm and is formed relatively thick, so that it is possible to reduce the electrostatic capacity between the semiconductor substrate SUB and the semiconductor layer SL to be small. It is considered that the an appropriate range of the thickness of the semiconductor layer SL is, for example, 100 to 300 nm (needless to say that the thickness is not limited to this range depending on other conditions). However, it is considered that a range centered at 200 nm is most suitable.

Here, as an example of the optical signal transmission line OTL, an optical phase shifter PS that changes optical phase will be described. The optical phase shifter PS is formed from the semiconductor layer SL that is formed over the semiconductor substrate SUB through the insulating film CL.

The semiconductor layer SL is processed into a rib shape. A thick portion (rib portion) in the semiconductor layer SL is an optical waveguide (also referred to as a core layer) WO1, which extends in a direction perpendicular to the page (the z direction shown in FIG. 1). Therefore, an optical signal introduced into the optical waveguide WO1 travels in the direction perpendicular to the page. The height of the optical waveguide WO1 (the dimension in the vertical direction on the page (the y direction shown in FIG. 1)) is, for example, about 200 nm. The width of the optical waveguide WO1 (the dimension in the horizontal direction on the page (the x direction shown in FIG. 1)) is, for example, about 500 nm. The thickness of a thin portion in the semiconductor layer SL is, for example, about 50 nm. Impurities are introduced into the optical waveguide WO1. The concentration of the impurities is, for example, in a range of $10^{15}$ to $10^{19}$ cm$^{-3}$, and a typical value of the concentration is, for example, about $10^{15}$ cm$^{-3}$.

In the semiconductor layer SL on one side of the optical waveguide WO1 (on the left side of the page), p-type impurities are introduced and a p-type semiconductor PR is formed. The p-type semiconductor PR is formed in parallel with the optical waveguide WO1. Further, in the semiconductor layer SL on the other side of the optical waveguide WO1 (on the right side of the page), n-type impurities are introduced and n-type semiconductor NR is formed. The n-type semiconductor NR is formed in parallel with the optical waveguide WO1. In other words, the semiconductor layer SL between the p-type semiconductor PR and the n-type semiconductor NR is the optical waveguide WO1.

When a forward bias is applied to the above structure, carriers are injected into the optical waveguide WO1. When the carriers are injected into the optical waveguide WO1, a carrier plasma effect (a phenomenon caused by electron hole pairs (plasma), the number of which is increased by optically generated carriers) occurs in the optical waveguide WO1, and the optical refractive index in the optical waveguide WO1 changes. When the optical refractive index in the optical waveguide WO1 changes, the wavelength of light traveling in the optical waveguide WO1 changes, so that it is possible to change the phase of the light in a process in which the light travels in the optical waveguide WO1.

The optical signal transmission line OTL is covered by a first interlayer insulating film ID1, a second interlayer insulating film ID2, and a protective film TC. The first interlayer insulating film ID1 and the second interlayer insulating film ID2 are formed of, for example, silicon oxide (SiO$_2$), and the thicknesses of the first interlayer insulating film ID1 and the second interlayer insulating film ID2 are, for example, 1 µm or more. The protective film IC is formed of, for example, silicon oxynitride (SiON). In the optical signal transmission line portion, a first layer wiring M1 and a second layer wiring M2 described later are not formed.

Optical Modulation Portion

As shown in FIG. 1, the optical modulation portion that converts an electrical signal into an optical signal is configured by the semiconductor layer SL formed of silicon, which is formed over the semiconductor substrate SUB through the insulating film CL. Here, as an example, the optical modulation portion of a pin structure will be described. However the optical modulation portion is not limited to the pin structure.

In the same manner as the optical signal transmission line OTL described above, the optical modulation portion of the pin structure is configured by the semiconductor layer SL which is formed over the semiconductor substrate SUB through the insulating film CL.

An optical waveguide (also referred to as a core layer) W02 formed from the semiconductor layer SL extends in the direction perpendicular to the page (the z direction shown in FIG. 1). Therefore, an optical signal introduced into the optical waveguide W02 travels in the direction perpendicular to the page. No impurities are introduced into the optical waveguide W02, and the optical waveguide W02 is formed of a pure semiconductor, that is, an i (intrinsic) type semiconductor.

In the semiconductor layer SL on one side of the optical waveguide W02 (on the left side of the page), p-type impurities are introduced and a p-type semiconductor PRS is formed. The p-type semiconductor PRS is formed in parallel with the optical waveguide W02. Further, in the semiconductor layer SL on the other side of the optical waveguide W02 (on the right side of the page), n-type impurities are introduced and n-type semiconductor NRS is formed. The n-type semiconductor NRS is formed in parallel with the optical waveguide W02. In other words, the semiconductor layer SL between the p-type semiconductor PRS and the n-type semiconductor NRS is the optical waveguide W02 formed of a pure semiconductor, and a pin structure is formed. Electrodes (first plugs PL1) are respectively coupled to the p-type semiconductor PRS and the n-type semiconductor NRS.

By voltages applied to the electrodes, the carrier density in the optical waveguide W02 formed of a pure semiconductor changes, and the refractive index in the region changes. Thereby, an effective refractive index of light propagating in the optical modulation portion changes, so that it is possible to change the phase of light outputted from the optical modulation portion.

The optical modulation portion is covered by the first interlayer insulating film ID1. In the first interlayer insulating film ID1, coupling holes (also referred to as contact holes) CT1 which respectively reach the p-type semiconductor PRS and the n-type semiconductor NRS are formed. A first plug PL1 using tungsten (W) as a main conductive material is buried inside the coupling hole CT1. The p-type semiconductor PRS is electrically coupled to the first layer wiring M1 through the first plug PL1, and the n-type semiconductor NRS is electrically coupled to the first layer wiring M1 through the first plug PL1. The first layer wiring M1 uses, for example, aluminum copper alloy (Al—Cu alloy) as a main conductive material. The thickness of the first layer wiring M1 is, for example, smaller than 1 µm.

The first layer wiring M1 is covered by the second interlayer insulating film ID2. In the second interlayer insulating film ID2, a coupling hole (also referred to as a via hole) CT2 reaching the first layer wiring M1 is formed. A second plug PL2 using tungsten (W) as a main conductive material is buried inside the coupling hole CT2. The first layer wiring M1 is electrically coupled to the second layer wiring M2 through the second plug PL2. The second layer wiring M2 uses, for example, aluminum copper alloy (Al—Cu alloy) as a main conductive material.

Photoelectric Conversion Portion

As shown in FIG. 1, the photoelectric conversion portion that converts an optical signal into an electrical signal is configured by partially including the semiconductor layer SL formed of silicon, which is formed over the semiconductor substrate SUB through the insulating film CL. Here, as an example, the photoelectric conversion portion of a pn junction structure in which a p-type semiconductor and an n-type semiconductor are bonded together will be described. However the photoelectric conversion portion is not limited to this structure.

The photoelectric conversion portion of the pn junction structure includes a p-type semiconductor PRO formed by introducing p-type impurities into the semiconductor layer SL that is formed over the semiconductor substrate SUB through the insulating film CL and an n-type semiconductor NRO formed of germanium (Ge), which is formed over the p-type semiconductor PRO. A silicon cap layer CAP for preventing damage such as roughing a surface or reducing a layer thickness of germanium (Ge) that forms the n-type semiconductor NRO is formed over the n-type semiconductor NRO.

Electrodes (first plugs PL1) are respectively coupled to the silicon cap layer CAP over the n-type semiconductor NRO and the p-type semiconductor PRO, and it is possible to take out direct current to the outside by a photovoltaic effect at the pn junction portion.

The photoelectric conversion portion is covered by the first interlayer insulating film ID1. In the first interlayer insulating film ID1, coupling holes CT1 which respectively reach the silicon cap layer CAP over the n-type semiconductor NRO and the p-type semiconductor PRO are formed. A first plug PL1 formed of tungsten (W) is buried inside the coupling hole CT1. The n-type semiconductor NRO is electrically coupled to the first layer wiring M1 through the first plug PL1, and the p-type semiconductor PRO is electrically coupled to the first layer wiring M1 through the first plug PL1.

The first layer wiring M1 is covered by the second interlayer insulating film ID2. In the second interlayer insulating film ID2, a coupling hole CT2 reaching the first layer wiring M1 is formed. A second plug PL2 formed of tungsten (W) is buried inside the coupling hole CT2. The first layer wiring M1 is electrically coupled to the second layer wiring M2 through the second plug PL2.

Wiring Coupling Portion

As shown in FIG. 1, the wiring coupling portion that couples together wiring formed in an optical device region and wiring formed in an electronic device region includes the second layer wiring M2. The wiring formed in the optical device region is wiring for propagating an electrical signal to the electronic device region after the photoelectric conversion portion converts an optical signal to the electrical signal. The wiring formed in the electronic device region is, for example, an electrical signal transmission line (also referred to as an electrical signal line) ETL.

Electrical Signal Transmission Line Portion

As shown in FIGS. 1 to 4, an electrical signal transmission line ETL is wiring that propagates an electrical signal converted from an optical signal in the optical device region to various electronic devices formed in the electronic device region, and the electrical signal transmission line ETL includes the second layer wiring M2. Therefore, the electrical signal transmission line ETL is formed over the second interlayer insulating film ID2.

The insulating film CL, the semiconductor layer SL, the first interlayer insulating film ID1, and the second interlayer insulating film ID2 lie between the electrical signal transmission line ETL and the semiconductor substrate SUB. For example, n-type impurities are introduced into the semiconductor layer SL (hereinafter referred to as a shielding semiconductor layer SSL) located below the electrical signal transmission line ETL. The concentration of the impurities is, for example, $10^{20}$ cm$^{-3}$ or more, and a typical value of the concentration is, for example, about $10^{21}$ cm$^{-3}$.

The shielding semiconductor layer SSL may have a solid plane shape including no opening in plan view. However, the shielding semiconductor layer SSL may also be an integrated semiconductor layer SL including a plurality of openings in plan view. For example, as shown in FIG. 5, the shielding semiconductor layer SSL may have a grid shape in plan view. Further, for example, as shown in FIG. 6, the shielding semiconductor layer SSL may have a stripe shape in plan view.

Further, a first noise cut wiring NM1 and a second noise cut wiring NM2, which are formed from the second layer wiring M2, are respectively formed on both sides of the electrical signal transmission line ETL in parallel with an extending direction of the electrical signal transmission line ETL. The protective film TC is located between the electrical signal transmission line ETL and the first noise cut wiring NM1 and between the electrical signal transmission line ETL and the second noise cut wiring NM2, so that the electrical signal transmission line ETL and the first noise cut wiring NM1 are insulated from each other and the electrical signal transmission line ETL and the second noise cut wiring NM2 are insulated from each other.

The first noise cut wiring NM1 is electrically coupled to the shielding semiconductor layer SSL located below the electrical signal transmission line ETL through a first conductive portion including a plurality of first plugs PL1 formed in the first interlayer insulating film ID1, the first layer wiring M1, and a plurality of second plugs PL2 formed in the second interlayer insulating film ID2. Similarly, the second noise cut wiring NM2 is electrically coupled to the shielding semiconductor layer SSL located below the electrical signal transmission line ETL through a second conductive portion including a plurality of first plugs PL1 formed in the first interlayer insulating film ID1, the first layer wiring M1, and a plurality of second plugs PL2 formed in the second interlayer insulating film ID2.

Therefore, the electrical signal transmission line ETL is surrounded by a shielding portion SP including the first noise cut wiring NM1, the second noise cut wiring NM2, the first conductive portion (the second plugs PL2, the first layer wiring M1, and the first plugs PL1), the second conductive portion (the second plugs PL2, the first layer wiring M1, and the first plugs PL1), and the shielding semiconductor layer SSL in a cross-section perpendicular to the extending direction of the electrical signal transmission line ETL. Here, the first noise cut wiring NM1 and the second noise cut wiring NM2 are fixed to a reference potential. Therefore, the entire shielding portion SP is fixed to the reference potential, so that it is possible for the shielding portion SP to block noise due to effects of a magnetic field or an electric field from the semiconductor substrate SUB, which affects the electrical signal transmission line ETL.

When the electrical signal transmission line ETL is not surrounded by the shielding portion SP, noise due to effects of the magnetic field or the electric field from the semiconductor substrate SUB enters the electrical signal transmission line ETL. For example, when a high-frequency signal passes through the electrical signal transmission line ETL, a loss occurs due to interference with the semiconductor substrate SUB and the loss becomes a propagation loss of an electrical signal, so that the quality of the electrical signal degrades.

However, in the first embodiment, the electrical signal transmission line ETL is surrounded by the shielding portion SP fixed to the reference potential, so that the noise due to effects of the magnetic field or the electric field from the semiconductor substrate SUB does not enter the electrical signal transmission line ETL. Therefore, it is possible to prevent the quality of the electrical signal from degrading. Further, in the first embodiment, the distance between the electrical signal transmission line ETL and the shielding semiconductor layer SSL is greater than or equal to 2 μm, which is equal to a total thickness of the first interlayer insulating film ID1 and the second interlayer insulating film ID2, so that it is possible to reduce the electrostatic capacity between the electrical signal transmission line ETL and the shielding semiconductor layer SSL to be small.

As shown in FIG. 2, in a cross-section perpendicular to an extending direction of the electrical signal transmission line ETL, one or the other first layer wiring M1 and the shielding semiconductor layer SSL are coupled to each other by two first plugs PL1. Further, the first noise cut wiring NM1 and one first layer wiring M1 are coupled to each other by two second plugs PL2 and the second noise cut wiring NM2 and the other first layer wiring M1 are coupled to each other by two second plugs PL2. However the numbers of the first plugs PL1 and the second plugs PL2 are not limited to the number described above.

For example, if low resistance coupling is possible, in a cross-section perpendicular to an extending direction of the electrical signal transmission line ETL, one or the other first layer wiring M1 and the shielding semiconductor layer SSL may be coupled to each other by one first plug PL1. Further, the first noise cut wiring NM1 and one first layer wiring M1 may be coupled to each other by one second plug PL2, and the second noise cut wiring NM2 and the other first layer wiring M1 may be coupled to each other by one second plug PL2. Alternatively, when much lower resistance coupling is required, in a cross-section perpendicular to an extending direction of the electrical signal transmission line ETL, one or the other first layer wiring M1 and the shielding semiconductor layer SSL may be coupled to each other by three or more first plugs PL1. Further, the first noise cut wiring NM1 and one first layer wiring M1 may be coupled to each other by three or more second plugs PL2, and the second noise cut wiring NM2 and the other first layer wiring M1 may be coupled to each other by three or more second plugs PL2.

By the way, the electrical signal transmission line ETL can be formed from the first layer wiring M1. However, in this case, the electrical signal transmission line ETL is formed over the first interlayer insulating film ID1, so that the distance between the electrical signal transmission line ETL and the shielding semiconductor layer SSL is small, and thus the electrostatic capacity between the electrical signal transmission line ETL and the shielding semiconductor layer SSL is large. Even in this case, when the thickness of the first interlayer insulating film ID1 is about 2 to 3 µm, it is possible to reduce the electrostatic capacity between the electrical signal transmission line ETL and the shielding semiconductor layer SSL to be small. However, it is difficult to form the coupling hole CT1 with a small diameter in the first interlayer insulating film ID1 with a high yield. Therefore, in the first embodiment, the electrical signal transmission line ETL is formed from the second layer wiring M2 and the distance between the electrical signal transmission line ETL and the shielding semiconductor layer SSL is set to a distance at which the electrostatic capacity can be reduced to be small.

In the first embodiment, multilayer wiring of two-layer structure is formed and the electrical signal transmission line ETL is formed from the second layer wiring M2. However, when wiring of three layers or more is formed, the electrical signal transmission line ETL may be formed from wiring of the second or higher layer. If a distance can be ensured at which the electrostatic capacity between electrical signal transmission line ETL and the shielding semiconductor layer SSL can be reduced to be small, the wiring from which the electrical signal transmission line ETL is formed is not limited.

Figure 16:
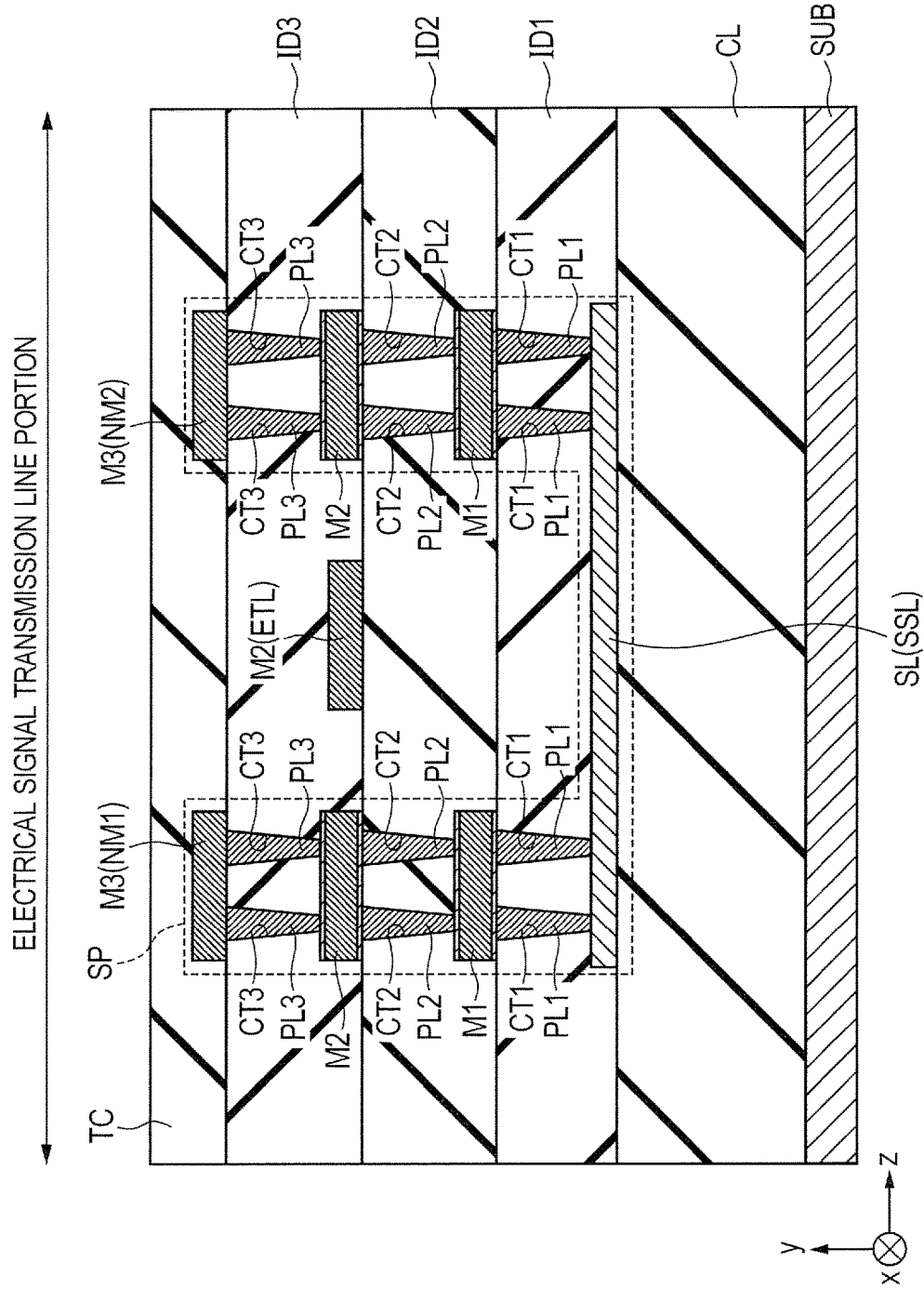
FIG. 16 is a main portion cross-sectional view of a modified example of the optical semiconductor device according to the first embodiment.

As an example, FIG. 16 shows a main portion cross-sectional view of an optical semiconductor device having multilayer wiring of three-layer structure. The optical semiconductor device has three-layer wiring including a first layer wiring M1, a second layer wiring M2, and a third layer wiring M3.

As shown in FIG. 16, the electrical signal transmission line ETL is formed from the second layer wiring M2, and the first noise cut wiring NM1 and the second noise cut wiring NM2, which are formed from the third layer wiring M3, are respectively formed on both sides of the electrical signal transmission line ETL in parallel with an extending direction of the electrical signal transmission line ETL. The first noise cut wiring NM1 is electrically coupled to the shielding semiconductor layer SSL through a first conductive portion including a plurality of first plugs PL1 formed in the first interlayer insulating film ID1, the first layer wiring M1, a plurality of second plugs PL2 formed in the second interlayer insulating film ID2, the second layer wiring M2, and a plurality of third plugs PL3 formed in the third interlayer insulating film ID3. Similarly, the second noise cut wiring NM2 is electrically coupled to the shielding semiconductor layer SSL through a second conductive portion including a plurality of first plugs PL1 formed in the first interlayer insulating film ID1, the first layer wiring M1, a plurality of second plugs PL2 formed in the second interlayer insulating film ID2, the second layer wiring M2, and a plurality of third plugs PL3 formed in the third interlayer insulating film ID3.

Therefore, the electrical signal transmission line ETL formed from the second layer wiring M2 is surrounded by a shielding portion SP including the first noise cut wiring NM1, the second noise cut wiring NM2, the first conductive portion, the second conductive portion, and the shielding semiconductor layer SSL in a cross-section perpendicular to the extending direction of the electrical signal transmission line ETL. The first conductive portion and the second conductive portion include the third plugs PL3, the second layer wiring M2, the second plugs PL2, the first layer wiring M1, and the first plugs PL1. Here, the first noise cut wiring NM1 and the second noise cut wiring NM2 are fixed to a reference potential. Therefore, the entire shielding portion SP is fixed to the reference potential, so that it is possible for the shielding portion SP to block noise due to effects of a magnetic field or an electric field from the semiconductor substrate SUB, which affects the electrical signal transmission line ETL.

In the first embodiment, the first noise cut wiring NM1 and the second noise cut wiring NM2 are not formed in the optical signal transmission line portion, and the optical signal transmission line OTL does not overlap with the first layer wiring M1 or the second layer wiring M2 in plan view. This is because to avoid trouble of optical signal occurring between the optical signal transmission line OTL and the first layer wiring M1 or the second layer wiring M2. However, when a distance between any wiring and the optical signal transmission line OTL is greater than or equal to the thickness of the insulating film CL, if trouble that affects the optical signal transmission line OTL does not occur, it is possible to form the wiring in the optical signal transmission line portion.

As described above, according to the first embodiment, the electrical signal transmission line ETL for an electrical signal converted from an optical signal is surrounded by the shielding portion SP formed of conductive material fixed to the reference potential along the extending direction of the electrical signal transmission line ETL, so that the noise due to effects of the magnetic field or the electric field from the semiconductor substrate SUB does not enter the electrical signal transmission line ETL. Therefore, it is possible to prevent the quality of the electrical signal from degrading.

Second Embodiment

Figure 7:
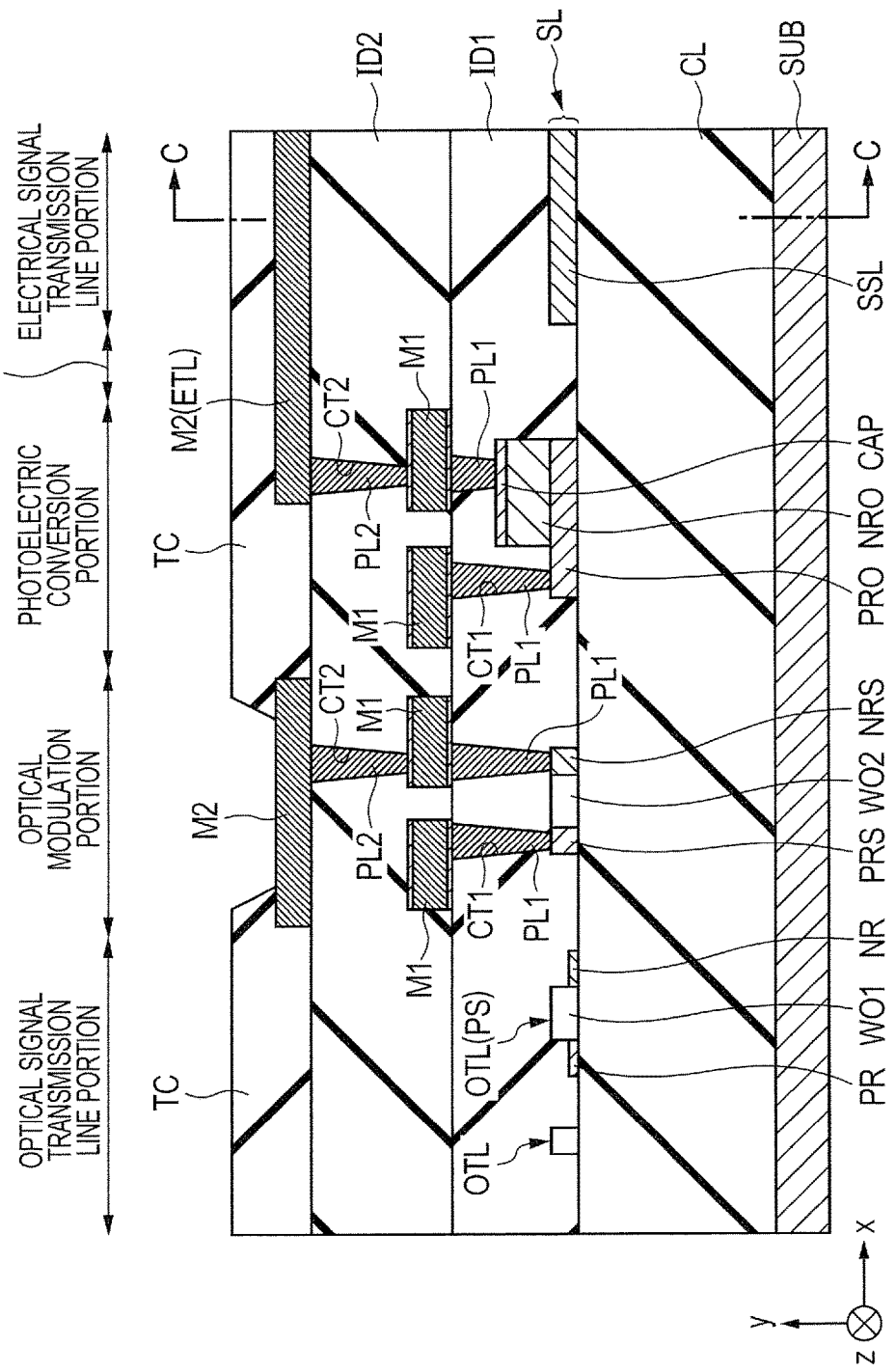
FIG. 7 is a main portion cross-sectional view of an optical semiconductor device according to a second embodiment.
Figure 8:
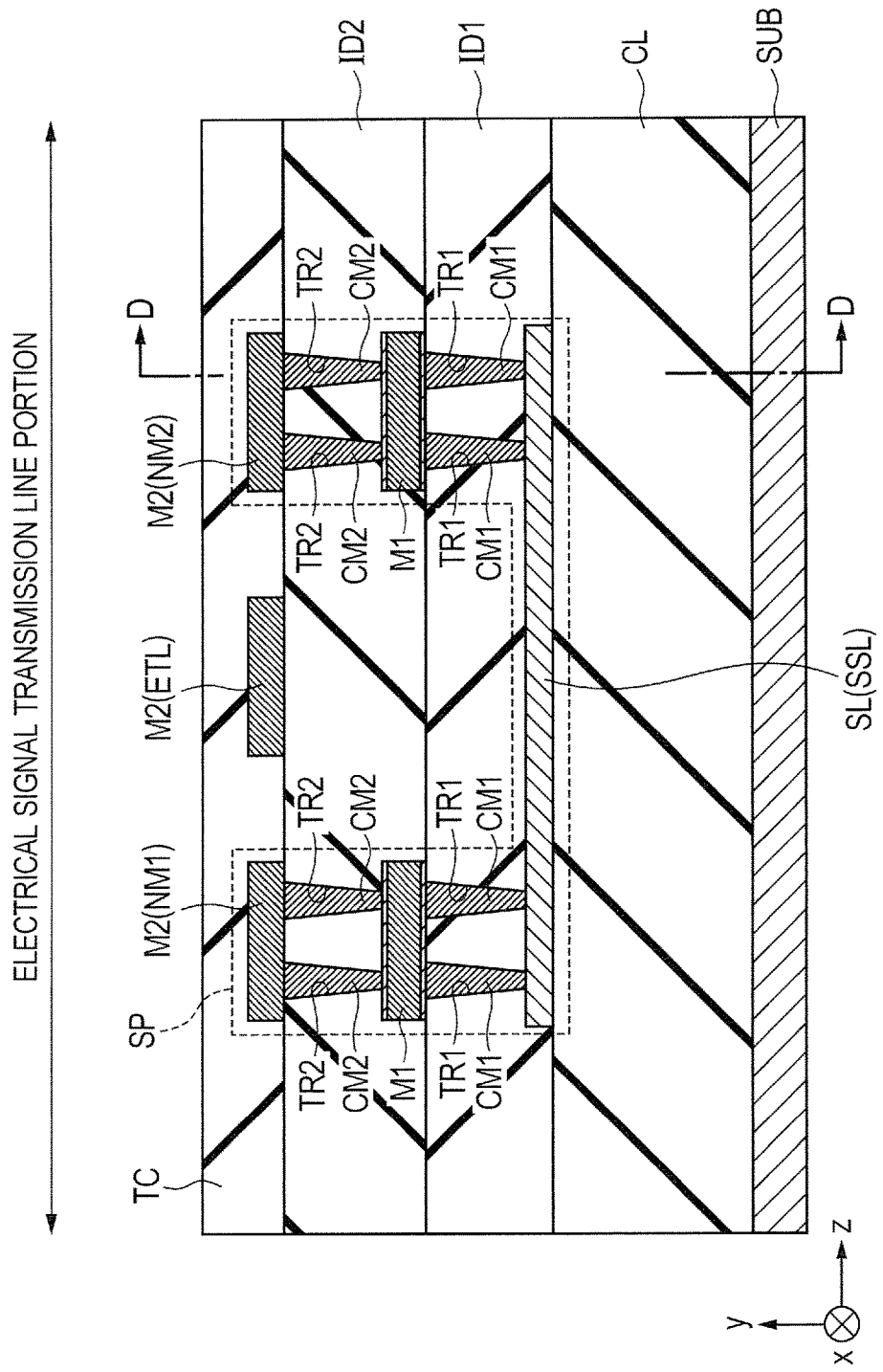
FIG. 8 is a main portion cross-sectional view of the optical semiconductor device taken along line C-C in FIG. 7.
Figure 9:
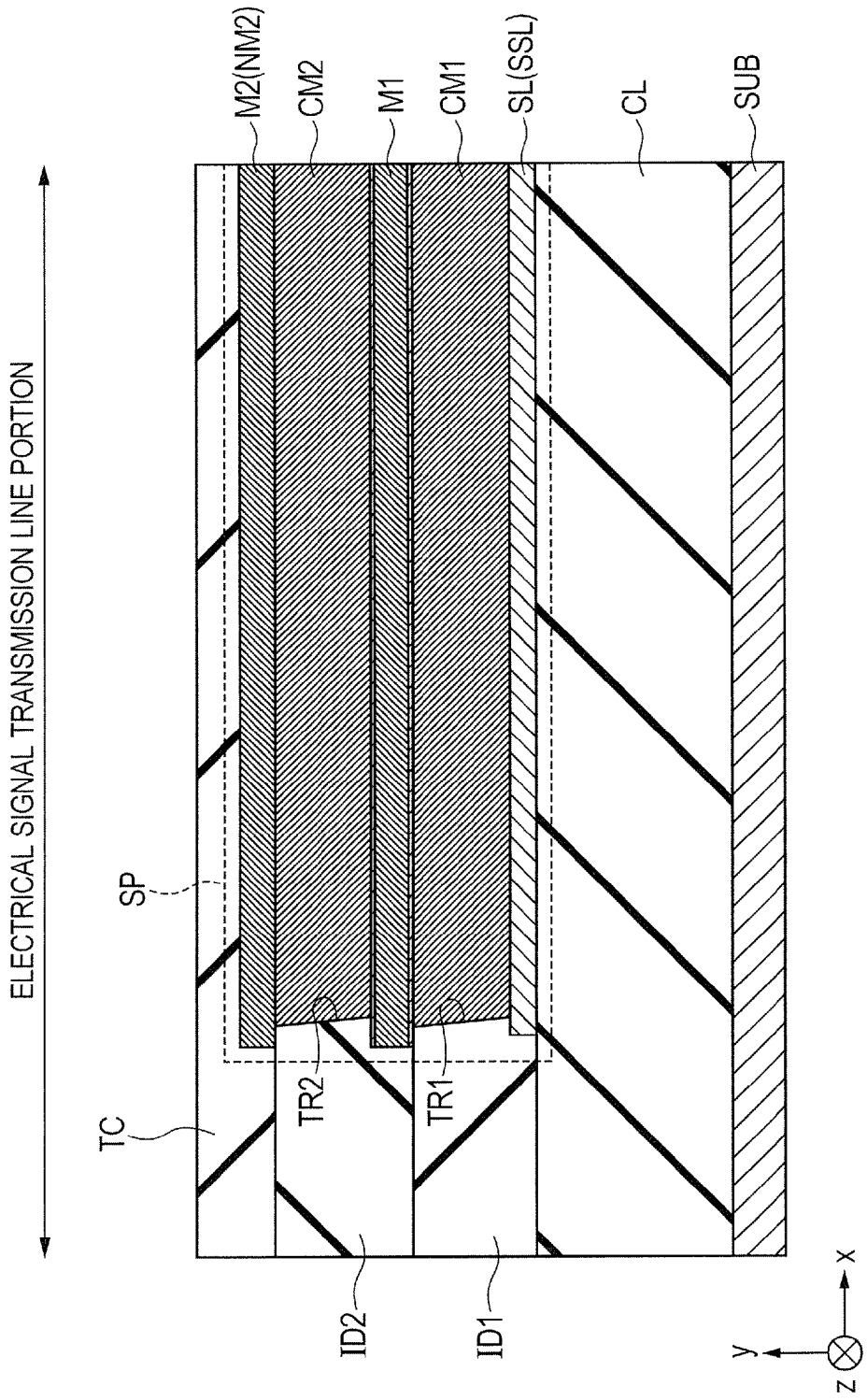
FIG. 9 is a main portion cross-sectional view of the optical semiconductor device taken along line D-D in FIG. 8.

An optical semiconductor device according to a second embodiment will be described with reference to FIGS. 7, 8, and 9. FIG. 7 is a main portion cross-sectional view of the optical semiconductor device according to the second embodiment. FIG. 8 is a main portion cross-sectional view of the optical semiconductor device taken along line C-C in FIG. 7. FIG. 9 is a main portion cross-sectional view of the optical semiconductor device taken along line D-D in FIG. 8.

A difference between the second embodiment and the first embodiment described above is mainly a structure of the shielding portion SP. The structure of the optical device is the same as that of the first embodiment, so that the description thereof will be omitted.

In the first embodiment described above, in the shielding portion SP, the first layer wiring M1 and the shielding semiconductor layer SSL are coupled by a plurality of first plugs PL1, the first noise cut wiring NM1 and the first layer wiring M1 are coupled by a plurality of second plugs PL2, and the second noise cut wiring NM2 and the first layer wiring M1 are coupled by a plurality of second plugs PL2.

In the second embodiment, as shown in FIGS. 7, 8, and 9, in the shielding portion SP, a series of trenches TR1 that reach the first layer wiring M1 and the shielding semiconductor layer SSL are formed in the first interlayer insulating film ID1 along the first layer wiring M1, and the first layer wiring M1 and the shielding semiconductor layer SSL are coupled by conductive material CM1 buried in the trenches TR1. Further, a series of trenches TR2 that reach the first noise cut wiring NM1 and the first layer wiring M1 are formed in the second interlayer insulating film ID2 along the first noise cut wiring NM1, and the first noise cut wiring NM1 and the first layer wiring M1 are coupled by conductive material CM2 buried in the trenches TR2. Similarly, a series of trenches TR2 that reach the second noise cut wiring NM2 and the first layer wiring M1 are formed in the second interlayer insulating film ID2 along the second noise cut wiring NM2, and the second noise cut wiring NM2 and the first layer wiring M1 are coupled by conductive material CM2 buried in the trenches TR2. The conductive materials CM1 and CM2 are, for example, tungsten (W).

As described above, according to the second embodiment, it is possible to completely shield the electrical signal transmission line ETL, so that the noise due to effects of the magnetic field or the electric field from the semiconductor substrate SUB is more prevented from entering the electrical signal transmission line ETL than in the first embodiment described above. Therefore, it is possible to more prevent the quality of the electrical signal from degrading.

Third Embodiment

Figure 10:
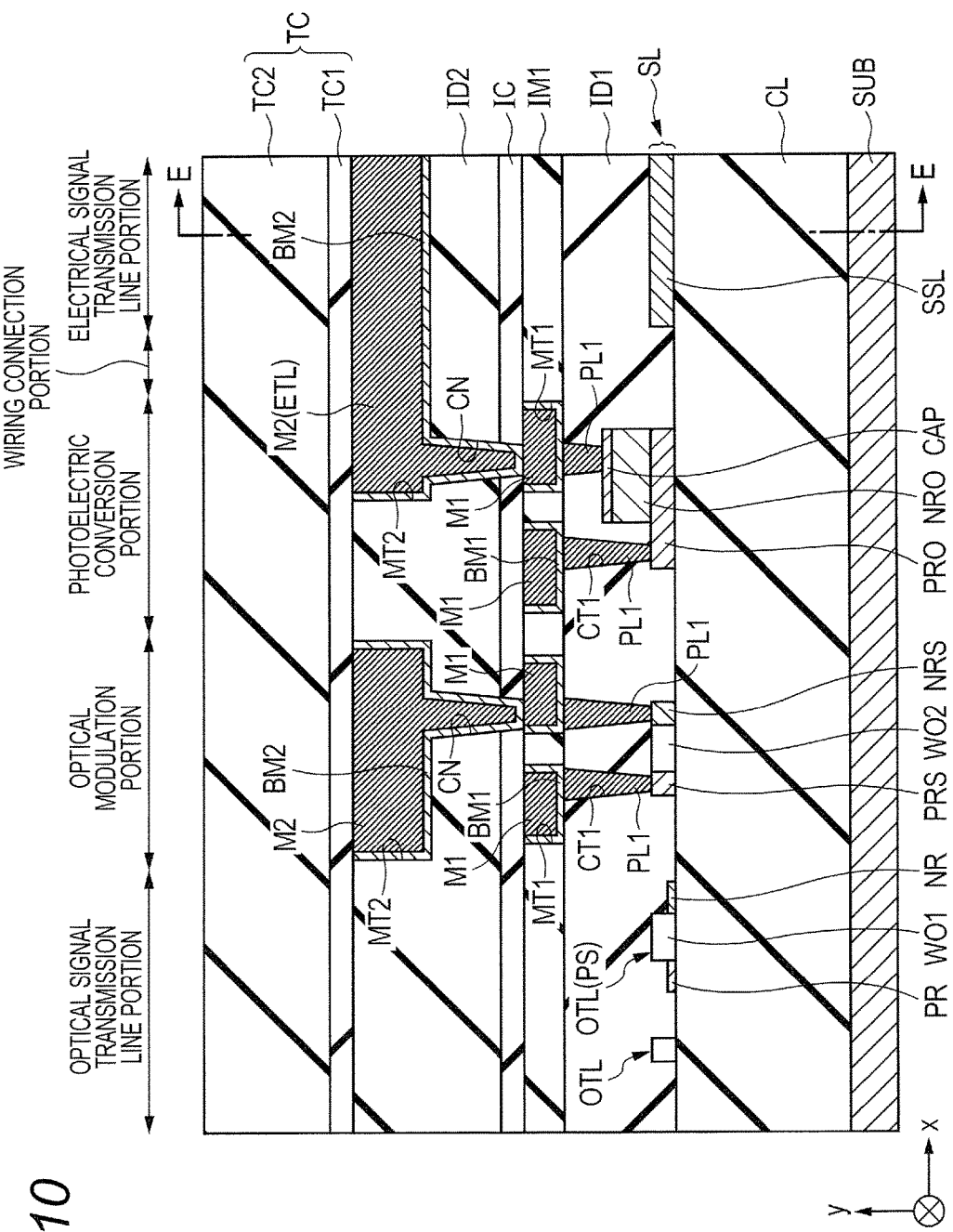
FIG. 10 is a main portion cross-sectional view of an optical semiconductor device according to a third embodiment.
Figure 11:
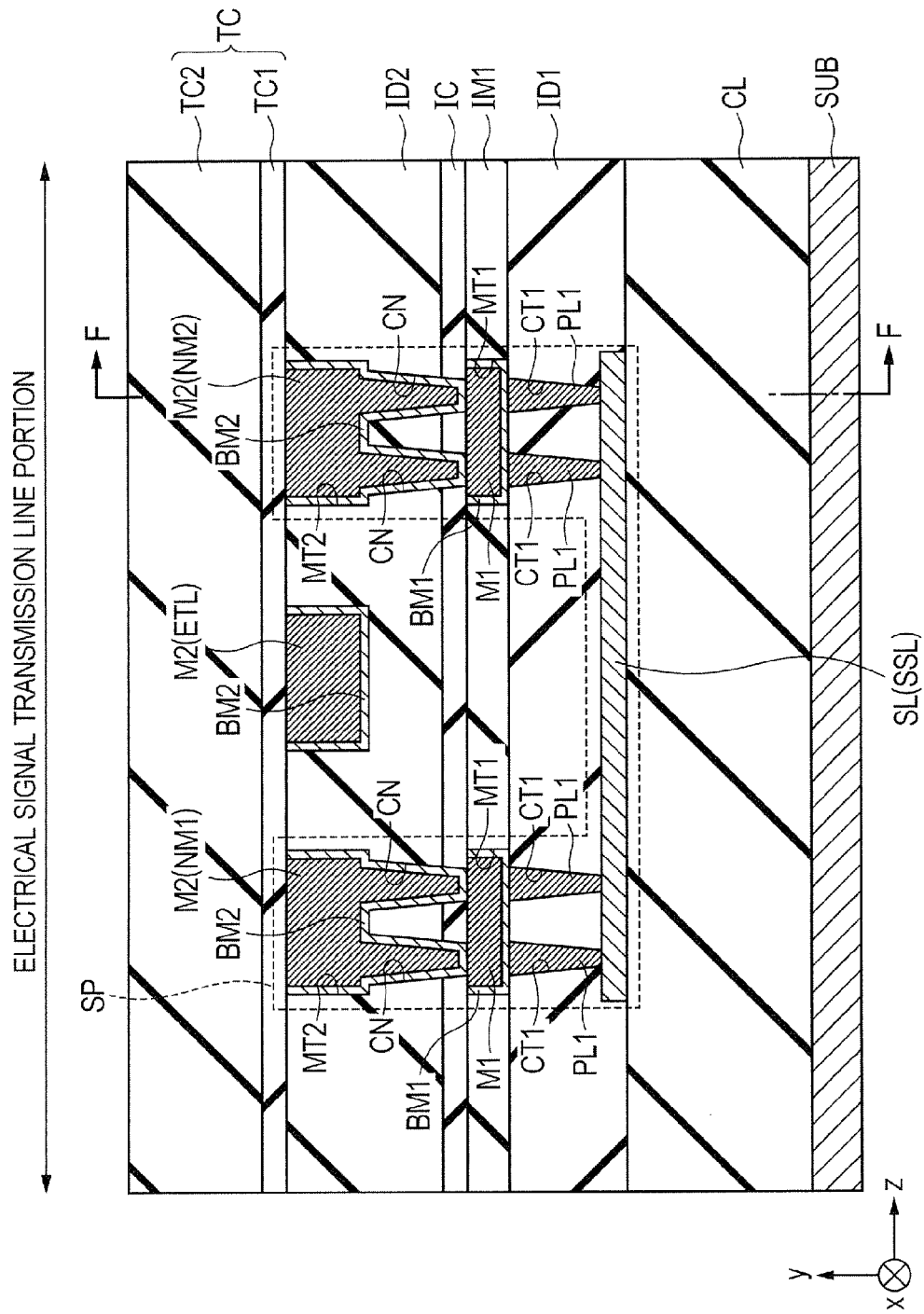
FIG. 11 is a main portion cross-sectional view of the optical semiconductor device taken along line E-E in FIG. 10.
Figure 12:
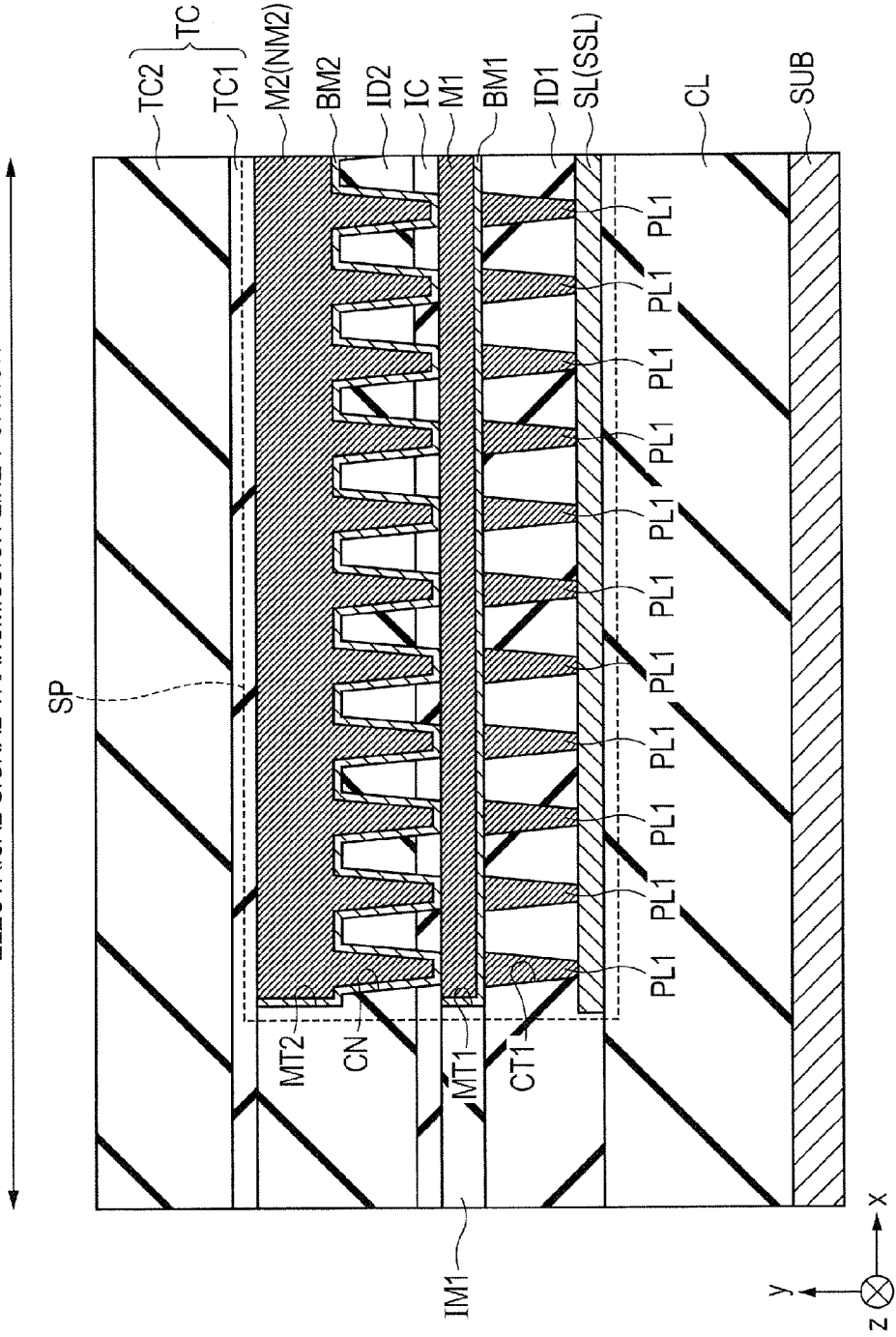
FIG. 12 is a main portion cross-sectional view of the optical semiconductor device taken along line F-F in FIG. 11.

An optical semiconductor device according to a third embodiment will be described with reference to FIGS. 10, 11, and 12. FIG. 10 is a main portion cross-sectional view of the optical semiconductor device according to the third embodiment. FIG. 11 is a main portion cross-sectional view of the optical semiconductor device taken along line E-E in FIG. 10. FIG. 12 is a main portion cross-sectional view of the optical semiconductor device taken along line F-F in FIG. 11.

A difference between the third embodiment and the first embodiment described above is mainly a structure of wiring. The structure of the optical device is the same as that of the first embodiment, so that the description thereof will be omitted.

In the first embodiment described above, the first layer wiring M1 and the second layer wiring M2 are formed by film formation of aluminum copper alloy (Al—Cu alloy) and etching using a photolithography technique.

In the third embodiment, as shown in FIGS. 10, 11, and 12, the first layer wiring M1 is formed by a single damascene method using copper (Cu) as a main conductive material and the second layer wiring M2 is formed by a dual damascene method using copper (Cu) as a main conductive material.

For example, the first layer wiring M1 is formed by the following manufacturing method by using the single damascene method.

First, a wiring forming insulating film IM1 is formed on the first interlayer insulating film ID1 in which a plurality of first plugs 1 are formed. The wiring forming insulating film IM1 is formed of, for example, carbonated silicon oxide (SiOC), porous carbonated silicon oxide (porous SiOC), or silicon oxide ($SiO_2$), which have low dielectric constant. Subsequently, a series of wiring trenches MT1 are formed in a predetermined region of the wiring forming insulating film IM1 by dry etching using a resist pattern as a mask, and thereafter a barrier metal film BM1 is formed over the wiring forming insulating film IM1 including the inside of the wiring trenches MT1. The barrier metal film BM1 is formed of, for example, titanium nitride (TiN), tantalum (Ta), or tantalum nitride (TaN). Subsequently, a seed layer of copper (Cu) is formed over the barrier metal film BM1 and a copper (Cu) plating film is further formed over the seed layer by an electrolytic plating method. The inside of the wiring trenches MT1 is filled with the copper (Cu) plating film. Subsequently, the first layer wiring M1 using copper (Cu) as a main conductive material is formed by removing the copper (Cu) plating film, the seed layer, and the barrier metal film BM1 in regions other than the wiring trenches MT1 by a CMP (Chemical Mechanical Polishing) method.

Subsequently, the second layer wiring M2 is formed by, for example, the following manufacturing method by using the dual damascene method.

First, a cap insulating film IC and the second interlayer insulating film ID2 are sequentially formed over the wiring forming insulating film IM1 where the first layer wiring M1 is formed. The cap insulating film IC is formed of a material having an etching selectivity with respect to the second interlayer insulating film ID2. For example, the cap insulating film IC is formed of silicon carbide (SiC), nitrogen added silicon carbide (SiCN), or silicon nitride (SiN), which have low dielectric constant. Further, the cap insulating film IC has a function as a protective film that prevents diffusion of copper (Cu) that forms the first layer wiring M1. The second interlayer insulating film ID2 is formed of, for example, carbonated silicon oxide (SiOC), porous carbonated silicon oxide (porous SiOC), or silicon oxide ($SiO_2$), which have low dielectric constant.

Subsequently, the second interlayer insulating film ID2 is processed by dry etching using a hole forming resist pattern as a mask. In this case, the cap insulating film IC functions as an etching stopper. Subsequently, the cap insulating film IC is processed. Subsequently, the second interlayer insulating film ID2 is processed by dry etching using a wiring trench forming resist pattern as a mask. Thereby, a series of wiring trenches MT2 are formed in an upper portion of the second interlayer insulating film ID2 and a plurality of coupling holes CN are formed in a lower portion of the second interlayer insulating film ID2 and the cap insulating film IC.

Subsequently, the second layer wirings M2 are formed in the coupling holes CN and the wiring trenches MT2. The second layer wiring M2 includes a barrier metal film BM2 and a copper (Cu) film that is a main conductive material, and a coupling member that couples together the second layer wiring M2 and the first layer wiring M1 is integrally formed with the second layer wiring M2.

First, a barrier metal film BM2 is formed over the second interlayer insulating film ID2 including the inside of the coupling holes CN and the wiring trenches MT2. The barrier metal film BM2 is formed of, for example, titanium nitride (TiN), tantalum (Ta), or tantalum nitride (TaN). Subsequently, a seed layer of copper (Cu) is formed over the barrier metal film BM2 and a copper (Cu) plating film is further formed over the seed layer by an electrolytic plating method. The inside of the coupling holes CN and the inside of the wiring trenches MT2 are filled with the copper (Cu) plating film. Subsequently, the second layer wiring M2 using copper (Cu) as a main conductive material is formed by removing the copper (Cu) plating film, the seed layer, and the barrier metal film BM2 in regions other than the coupling holes CN and the wiring trenches MT2 by a CMP (Chemical Mechanical Polishing) method.

The second layer wiring M2 is covered by a protective film TC including a lower layer protective film TC1 formed of, for example, silicon carbide (SiC), nitrogen added silicon carbide (SiCN), or silicon nitride (SiN), which have low dielectric constant, and an upper layer protective film TC2 formed of, for example, silicon oxide ($SiO_2$).

As described above, in the third embodiment, the first layer wiring M1 and the second layer wiring M2 which use copper (Cu) as a main conductive material are used and an insulating film of low dielectric constant is used for the wiring forming insulating film IM1, the cap insulating film IC, the second interlayer insulating film ID2, and the lower layer protective film TC1, so that the delay time of electrical signals is smaller than that in the first embodiment and it is possible to increase an operating frequency.

Fourth Embodiment

Figure 13:
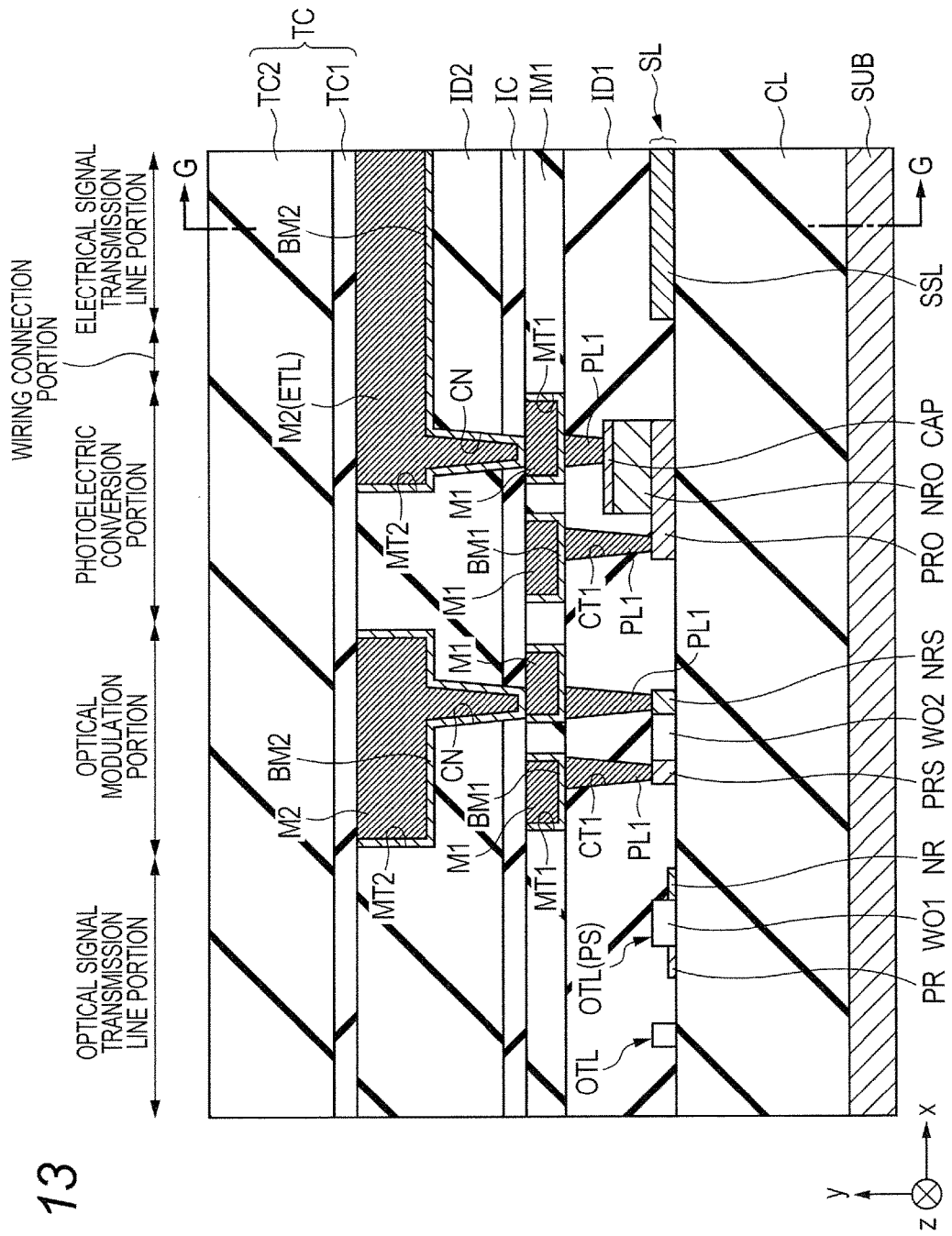
FIG. 13 is a main portion cross-sectional view of an optical semiconductor device according to a fourth embodiment.
Figure 14:
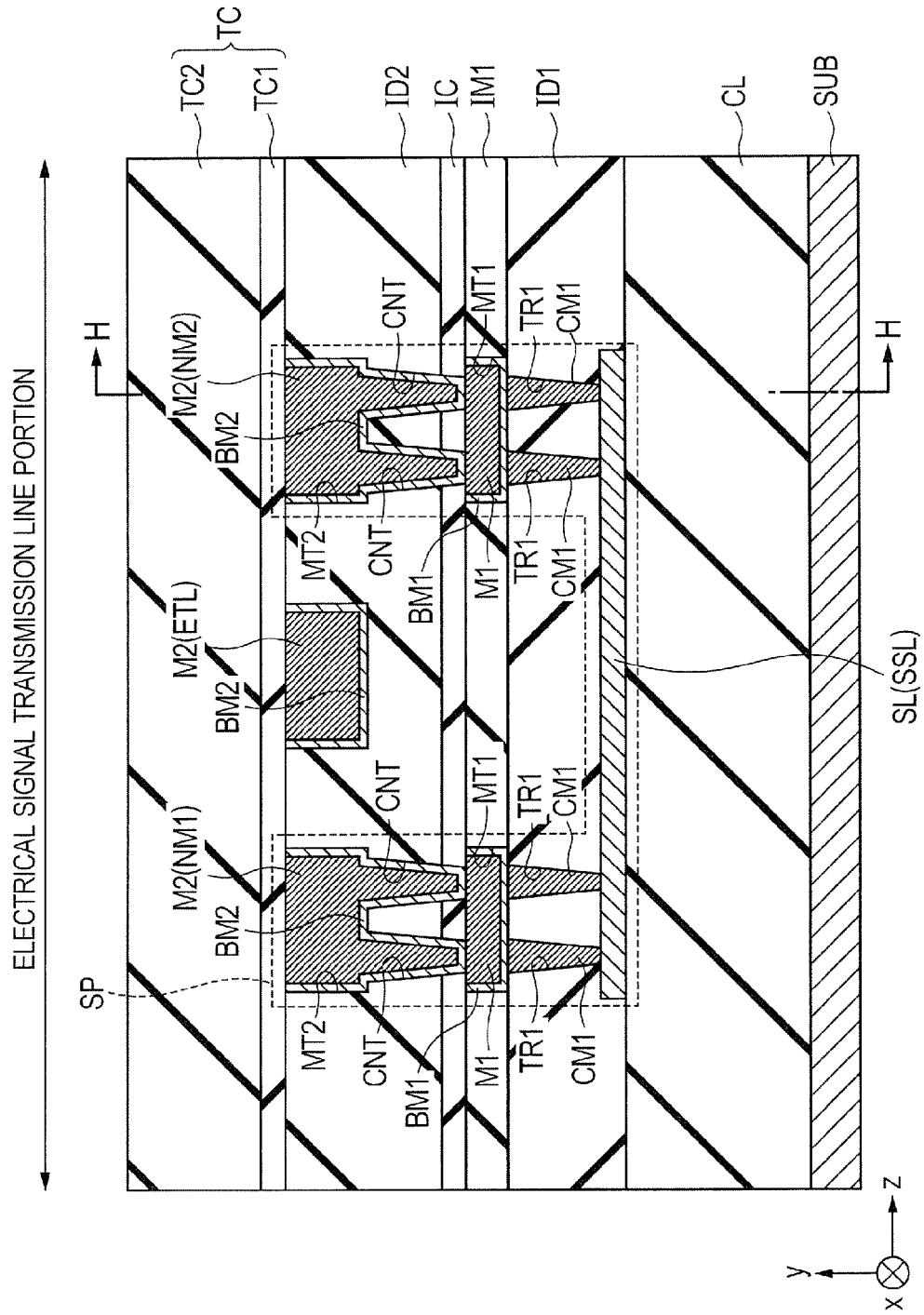
FIG. 14 is a main portion cross-sectional view of the optical semiconductor device taken along line G-G in FIG. 13.
Figure 15:
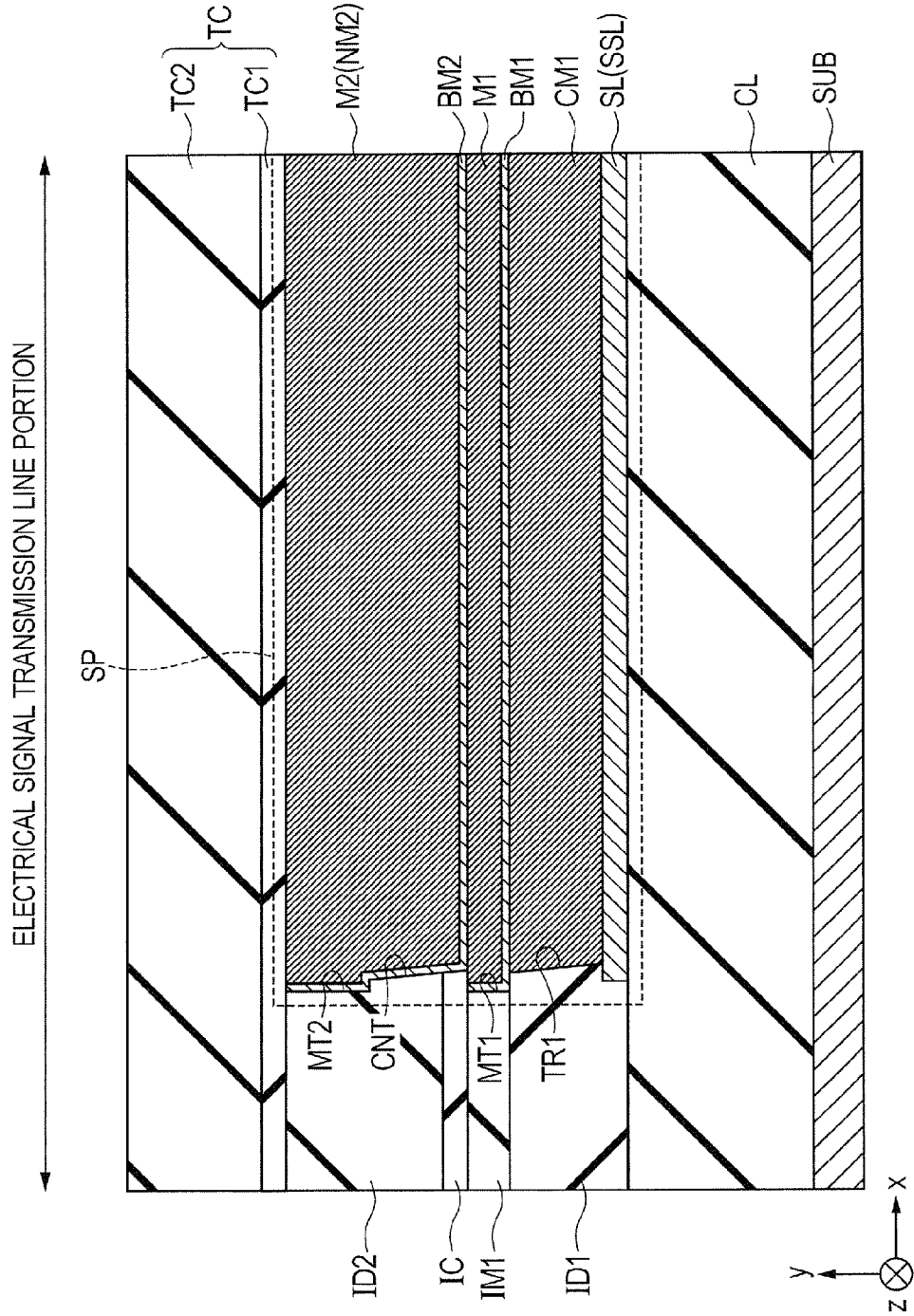
FIG. 15 is a main portion cross-sectional view of the optical semiconductor device taken along line H-H in FIG. 14.

An optical semiconductor device according to a fourth embodiment will be described with reference to FIGS. 13, 14, and 15. FIG. 13 is a main portion cross-sectional view of the optical semiconductor device according to the fourth embodiment. FIG. 14 is a main portion cross-sectional view of the optical semiconductor device taken along line G-G in FIG. 13. FIG. 15 is a main portion cross-sectional view of the optical semiconductor device taken along line H-H in FIG. 14.

A difference between the fourth embodiment and the first embodiment described above is mainly a structure of the shielding portion SP and a structure of the wiring. The structure of the optical device is the same as that of the first embodiment, so that the description thereof will be omitted.

In the first embodiment described above, in the shielding portion SP, the first layer wiring M1 and the shielding semiconductor layer SSL are coupled by a plurality of first plugs PL1, the first noise cut wiring NM1 and the first layer wiring M1 are coupled by a plurality of second plugs PL2, and the second noise cut wiring NM2 and the first layer wiring M1 are coupled by a plurality of second plugs PL2. In the first embodiment described above, the first layer wiring M1 and the second layer wiring M2 are formed by film formation of aluminum copper alloy (Al—Cu alloy) and etching using photolithography technique.

In the fourth embodiment, as shown in FIGS. 13, 14, and 15, in the shielding portion SP, a series of trenches TR1 that reach the first layer wiring M1 and the shielding semiconductor layer SSL are formed in the first interlayer insulating film ID1 along the first layer wiring M1, and the first layer wiring M1 and the shielding semiconductor layer SSL are coupled by the conductive material CM1 buried in the trench TR1. The conductive material CM1 is, for example, tungsten (W).

Further, a series of coupling trenches CNT that reach the first noise cut wiring NM1 and the first layer wiring M1 are formed in a lower portion of the second interlayer insulating film ID2 and the cap insulating film IC along the first noise cut wiring NM1, and the first noise cut wiring NM1 and the first layer wiring M1 are coupled by a conductive material formed integrally with the first noise cut wiring NM1 in the coupling trench CNT. Similarly, a series of coupling trenches CNT that reach the second noise cut wiring NM2 and the first layer wiring M1 are formed in a lower portion of the second interlayer insulating film ID2 and the cap insulating film IC along the second noise cut wiring NM2, and the second noise cut wiring NM2 and the first layer wiring M1 are coupled by a conductive material formed integrally with the second noise cut wiring NM2 in the coupling trench CNT. Further, the first layer wiring M1 is formed by a single damascene method using copper (Cu) as a main conductive material and the second layer wiring M2 is formed by a dual damascene method using copper (Cu) as a main conductive material.

As described above, according to the fourth embodiment, it is possible to completely shield the electrical signal transmission line ETL, so that the noise due to effects of the magnetic field or the electric field from the semiconductor substrate SUB is more prevented from entering the electrical signal transmission line ETL than in the first embodiment described above. Therefore, it is possible to more prevent the quality of the electrical signal from degrading. Further, the first layer wiring M1 and the second layer wiring M2 which use copper (Cu) as a main conductive material are used, and an insulating film of low dielectric constant is used for the wiring forming insulating film IM1, the cap insulating film IC, the second interlayer insulating film ID2, and the lower layer protective film TC1, so that the delay time of electrical signals is smaller than that in the first embodiment and it is possible to increase an operating frequency.

While the invention made by the inventors has been specifically described based on the embodiments, the invention is not limited to the embodiments, but needless to say that the invention may be modified in various ways without departing from the scope of the invention.

What is claimed is:

1. An optical semiconductor device comprising:
    a semiconductor substrate;
    a first insulating film formed over the semiconductor substrate;
    an optical waveguide of an optical signal transmission line formed from a semiconductor layer formed in a first region over the first insulating film;
    a shielding semiconductor layer formed from the semiconductor layer formed in a second region different from the first region over the first insulating film;
    a multilayer wiring of n layers (n≥2);
    an electrical signal transmission line which is formed by mth layer wiring (n≥m≥1) in the second region and which propagates an electrical signal converted from an optical signal;
    a first noise cut wiring and a second noise cut wiring which are respectively formed on both sides of the electrical signal transmission line and which are formed from the mth layer wiring (n≥m≥1) that is away from and in parallel with the electrical signal transmission line;
    a first conductive portion that electrically couples the first noise cut wiring and the shielding semiconductor layer; and
    a second conductive portion that electrically couples the second noise cut wiring and the shielding semiconductor layer,
    wherein, in a cross-section perpendicular to an extending direction of the electrical signal transmission line, the electrical signal transmission line is surrounded by a shielding portion including the first noise cut wiring, the second noise cut wiring, the first conductive portion, the second conductive portion, and the shielding semiconductor layer, the shielding portion being fixed to a reference potential.

2. The optical semiconductor device according to claim 1, wherein a concentration of impurities of the shielding semiconductor layer is higher than that of the optical waveguide of the optical signal transmission line.

3. The optical semiconductor device according to claim 2, wherein the concentration of impurities of the shielding semiconductor layer is $10^{20}$ cm$^{-3}$ or more.

4. The optical semiconductor device according to claim 1, wherein a first distance between the semiconductor substrate and the shielding semiconductor layer and a second distance between the shielding semiconductor layer and the electrical signal transmission line are 2 µm or more.

5. The optical semiconductor device according to claim 1, wherein a second insulating film formed of SiOC, SiC, or SiCN is formed between the shielding semiconductor layer and the electrical signal transmission line.

6. The optical semiconductor device according to claim 1, wherein the shielding semiconductor layer is formed of an integrated semiconductor layer having a plurality of openings in plan view.

7. The optical semiconductor device according to claim 6, wherein the shielding semiconductor layer has a grid shape in plan view.

8. The optical semiconductor device according to claim 6, wherein the shielding semiconductor layer has a stripe shape in plan view.

9. The optical semiconductor device according to claim 1, wherein among the multilayer wiring of n layers (n≥2), from a first layer wiring located closer to the optical signal transmission line than a first distance between the semiconductor substrate and the semiconductor layer to an (n−1)th layer wiring does not overlap with the optical signal transmission line in plan view.

* * * * *